United States Patent [19]
Schmid

[11] 4,092,972
[45] June 6, 1978

[54] PROCESS OF CUTTING WAFERS

[75] Inventor: Frederick Schmid, Marblehead, Mass.

[73] Assignee: Crystal Systems, Inc., Salem, Mass.

[21] Appl. No.: 767,809

[22] Filed: Feb. 11, 1977

[51] Int. Cl.² .............................................. B28D 1/08
[52] U.S. Cl. .................................. 125/16 R; 51/263; 51/21
[58] Field of Search ..................... 125/12, 13 R, 16 R, 125/18, 21; 51/263

[56]           References Cited
       U.S. PATENT DOCUMENTS

| 2,073,678 | 3/1937 | Broughton | 125/15 |
| 2,369,068 | 2/1945 | Mentzer | 125/21 |
| 2,793,478 | 5/1957 | Rohowetz | 125/214 X |
| 3,540,427 | 11/1970 | Anderson | 125/21 |

Primary Examiner—Harold D. Whitehead

[57]           ABSTRACT

In a cutting process in which a blade under tension is moved relative to a workpiece, that improvement wherein the blade has a longitudinally-extending abrasive-holding portion defined by blade material that is softer than the workpiece to be cut and overlies a high tensile strength core, the blade is placed under tension adjacent a charging element, and abrasive particles are introduced into the interface between the blade and charging element and partially embedded in the abrasive-holding portion by moving the blade relative to the charging element while forcing the blade and element towards each other.

23 Claims, 9 Drawing Figures

PROCESS OF CUTTING WAFERS

This invention relates to cutting hard materials such as quartz, silicon, sapphire and galium arsenide and, more particularly, to slicing ingots of such materials into thin wafers.

There are two principal modes of cutting such materials. In the first, called two-body abrasion cutting, abrasive particles are bonded to a blade (e.g., diamond particles embedded or held fixed in a cutting wheel or wire) much like conventional sandpaper. In this process, the workpiece and abrasive particles are worn away during cutting. There is little or no wearing of the blade.

The second cutting process is known as three-body abrasion. In it, loose abrasive particles are introduced between the blade and workpiece, generally as part of an oil/abrasive particle slurry. In this process, both the blade and workpiece are abraded, in addition to the wearing away of the abrasive particles.

Each method of cutting has both advantages and drawbacks. In two-body abrasive cutting, the cutting rate is an order of magnitude higher than in three-body cutting, and the width of the kerf (the amount of material removed) is somewhat less. However, the cutting rate is very dependent on cutting pressure, the blades are quite expensive, the total amount of abrasive present is relatively small, the abrasive particles can pull out or become dull, and the blades must be replaced, often in the middle of a cut.

A typical cutting wire used in two-body cutting of hard materials, now being sold by Laser Technology, Inc. of North Hollywood, California, comprises a wire having a high strength core covered by an electrolytic copper sheath. The copper sheath is impregnated all around with diamond abrasive particles. During cutting, fluid (without abrasive) is dripped or flushed onto the wires and workpiece.

In three-body abrasive cutting, a abrasive slurry (typically a mixture of abrasive particles and oil) is continuously dripped over the blades and workpiece. Because new abrasive is continuously being introduced between the blade and workpiece, wear of abrasive particles themselves is not a serious problem. The rate of cutting, however, is relatively slow; kerf width is relatively high; and the cutting blade itself sometimes wears out and must be changed in the middle of a cut.

It is a primary object of the present invention to provide a cutting process that combines the advantages, without the drawbacks, of both two and three body abrasion processes, which eliminates the necessity of changing blades in the middle of a cut, and obtains results that are superior to prior processes. Other objects including providing a cutting process that has a higher cutting rate, lower cost per cut, less blade wear, less chance of blade breakage and less blade wander, requiring less blade tension and abrasive, and producing a thinner kerf than other cutting processes heretofore available.

The invention features, in a cutting process in which a blade under tension is moved relative to a workpiece, that improvement wherein the blade has a longitudinally-extending abrasive-holding portion defined by blade material that is softer than the workpiece to be cut and overlies a high tensile strength core, the blade is placed under tension adjacent a charging element, and abrasive particles are introduced into the interface between the blade and charging element and partially embedded in the portion of abrasive-holding portion facing the charging element by moving the blade relative to the block while forcing the blade and element towards each other. In preferred embodiments in which the charging element comprises an annularly grooved cylinder, the abrasive-holding portion of the blade is defined by a tempered or plated portion having a hardness less than about 40 $R_c$ and a thickness not more than about 0.025 in., and the portion of the abrasive holding portion into which abrasive is charged defines in transverse cross-section an arc of less than 180° there is featured recharging the blade by embedding new abrasive particles in the abrasive-holding portion after the previously embedded particles have pulled out or become dull, and stripping worn particles from the blade by feeding a slurry of blocky or rounded particles typically $B_4C$ and oil, to the blade while reciprocating the blade under pressure relative to the charging element or workpiece.

Other objects, features and advantages will appear from the following detailed description of a preferred method of practicing the invention, taken together with the attached drawings in which.

Figure 1:
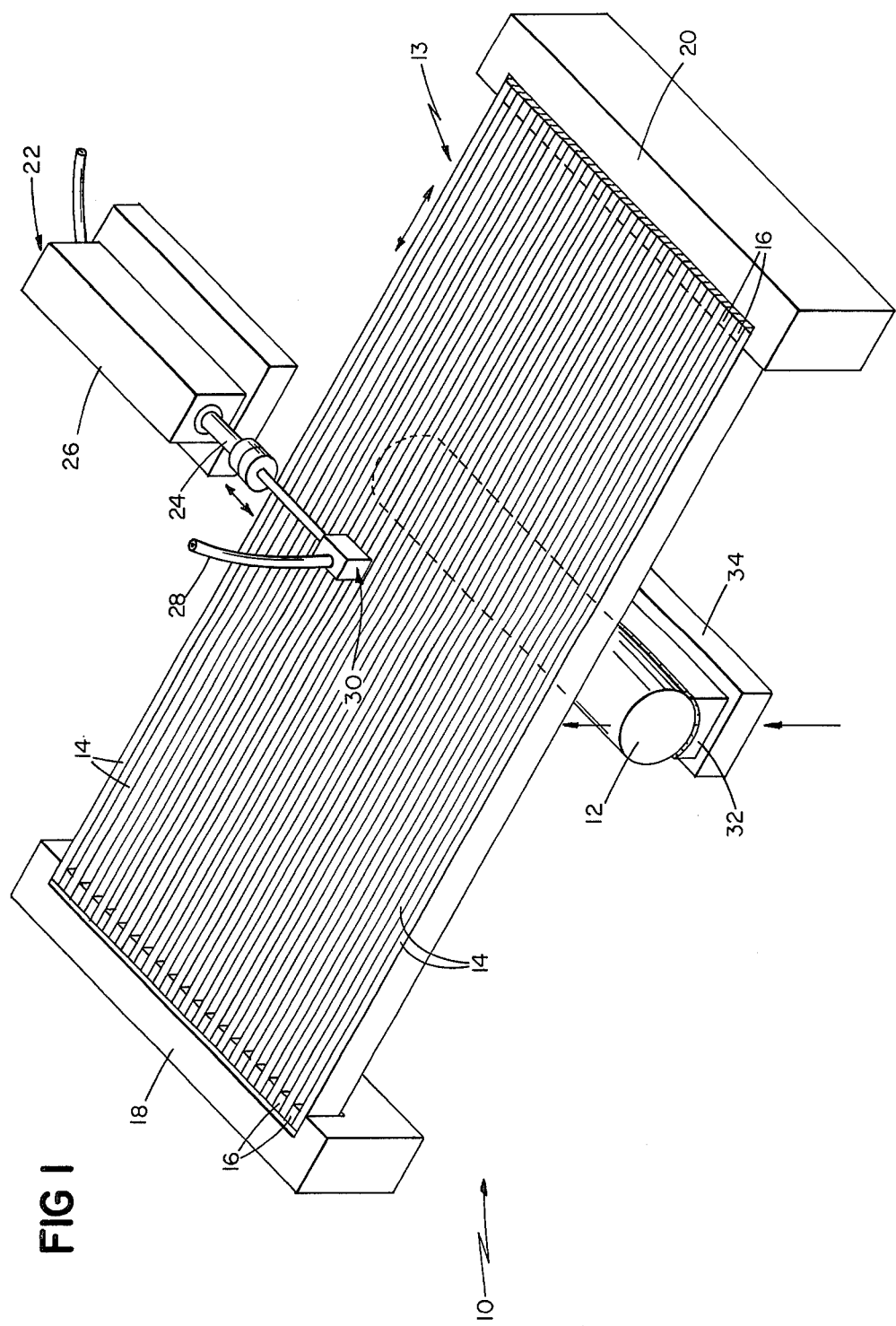
FIG. 1 is a simplified view of a cutting machine used in the practice of the invention.
Figure 2:
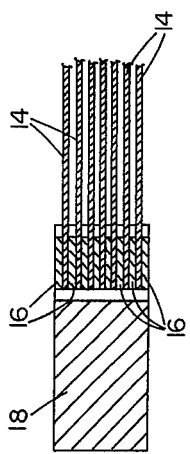
FIG. 2 is a sectional view of a portion of the member of FIG. 1.

Referring now to FIGS. 1–2 there is shown in simplified form a wafering machine, generally designated 10, for slicing an ingot 12 into thin wafers. Wafering machine 10, as shown, is a conventional machine of the type sold by Varian Associates under the designation "Model 686 Wafering Machine", and was designed primarily for slicing and dicing semiconductor and other brittle materials such as silicon, germanium and quartz. As shown in FIGS. 1 and 2 the machine includes a blade package 13 comprising a plurality of parallel blades 14, separated by spacers 16 and held in tension between a pair of blade holding blocks 18, 20. The blade package 13 is mounted in a blade head assembly (not shown) and the entire frame is reciprocated (typically at the rate of 50 to 200 eight inch strokes per minute) by a motor driving a crank disc and connecting rod. The construction of the blade package, blade head assembly driving motor and associated apparatus are described in detail in U.S. Pat. Nos. 3,079,908 and 3,263,669, which are hereby incorporated by reference.

A slurry feed system 22 is mounted at one side of blade package 13, vertically aligned over the ingot 12 to be cut, for feeding an abrasive slurry (in conventional cutting) or cooling fluid (according to the present invention) over the blades and ingot during cutting. As shown, feed system 22 includes a reciprocating arm 24 which is driven by an air motor 26 back and forth over blade assembly 13, perpendicular to the direction of blade reciprocation. A pump (not shown) supplies the slurry or cutting fluid through hose 28 to a supply head 30 at the end of arm 24, from which it is dripped over the reciprocating blades at the desired rate.

The ingot 12 is cemented to a mounting block 32, typically using Anco brand Improved DeKhotinsky cement, or Eastman 910 brand sold by Eastman Chemical Products, Inc. of Kingsport, Tennessee. Mounting block 32 is, in turn, supported on a vertically movable submount 34. A pneumatic feed system (not shown) is attached to submount 34 for feeding ingot 12 upwardly into the reciprocating blades with a desired preset force.

Figure 3:
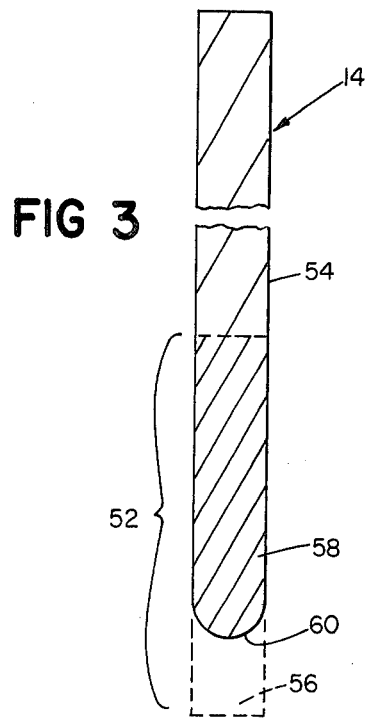
FIGS. 3, 3a and 4 are sectional views of blades used in the practice of the present invention.
Figure 4:
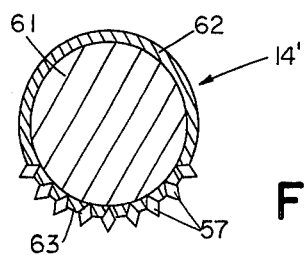
Figure 3A:
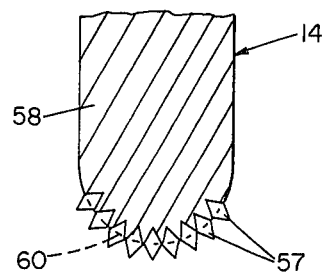

According to the present invention, the blades used in wafering machine 10 are either rectangular blades 14 having the cross-section shown in FIG. 3, or cutting wires 14' having the transverse cross-section shown in FIG. 4.

Referring particularly to FIG. 3, each of blades 14 comprises a commercially available hardened steel blade, typically 3/16 or ½ inch high and 0.002 to 0.015 in. wide of 1095 steel hardened to about 55 $R_c$. According to the present invention, the lower edge of the blade is treated to provide a softer (about 35 $R_c$) abrasive-holding portion 52 extending the full length and width of the blade and having a depth of about 400 microns (0.016 in.). The rest of blade 14, i.e., the remaining hardened steel portion, provides a core 54 of high tensile strength. In practice, abrasive-holding portion 52 may comprise either a soft material plated onto the lower edge of blade 14, or a portion of the original commercially available blade that has been softened by heat treating.

Typically, the structure of the commercially purchased hard steel blade is a slightly tempered martensite. This material can be softened by tempering at various times and temperatures, as is well known in the metallurgy art. Among the methods satisfactory for heating and tempering the steel along the lower edge of the blade to provide softened edge portion 52 are resistance, induction and electron beam heating.

When the edge portion 52 of blade 14 is so treated, the initial result is a hard outermost skin 56, having a depth of about 50 to 75 microns, overlying a softer section 58 about 400 microns (0.016 in.) deep. A typical profile of the heat treated blade shows the following hardnesses at the indicated depths:

| Depth (Microns) | Hardness $R_c$ |
| --- | --- |
| 25 | 64 |
| 50 | 58 |
| 75 | 47 |
| 100 | 33 |
| 150 | 33 |
| 200 | 37 |
| 250 | 38 |
| 400 | 40 |
| 500 | 43 |

To provide a finished blade, the outer hardened skin 56 is ground away (typically to a depth of 100 microns to insure it has all been removed) leaving therebelow the desired softer portion having, throughout the desired 400 micron depth, a hardness not greater than about 40 to 45 $R_c$ and, adjacent the outer surface 60, a hardness not greater than about 35 $R_c$.

As shown in FIG. 3, the outer surface 60 of the remaining softer portion 58 is ground into a generally semi-circular in cross-section configuration so that when the blade is put into use there will be no sharp outer edges to be worn away.

To form the abrasive holding portion 52 by plating, a layer of soft material such as copper or nickel is electrolytically deposited to a minimum depth of about 0.001 to 0.002 in. on the lower edge of the commercially purchased blade and upwardly along the blade's outer sides to a height of about 1/16 in. Plated blades are somewhat less satisfactory than blades in which the soft portion is formed by heat treating since plating adds to the overall width of the blade (and thus increases the kerf width) and because a substantial depth of plating is required if the lower edge of the blade is to be ground into the usually desired semi-circular cross-section.

Referring now to FIG. 4, there is shown a cutting wire 14' comprising a central core 61 of high tensile strength plated with a soft peripheral layer 62 of, typically, copper or nickel, about 0.0005 to 0.001 in. thick. The thickness of the layer depends on the size of the abrasive particles to be embedded therein and should not be less than about half the nominal size of those particles. Thus, for example, when 45 micron particles are used, the thickness of layer 62 should not be less than about 0.001 in. The diameter of the core, typically of stainless of high tensile strength steel, is usually in the range of 0.002 to 0.015 in.

In use, blades 14 or cutting wires 14' are mounted in blade package 13 at the proper blade tension, in the manner known to those skilled in the art, and are then charged with abrasive. The abrasive particles should be irregular in shape and have a large number of sharp edges. A diamond-shape has been found particularly satisfactory. If the particles are too flat, they may lie flat and not become embedded in the blades. Similarly, blocky abrasives, such as $B_4C$, tend to roll between a blade and workpiece or charging element, rather than dig into the soft blade outer surface. For cutting very hard materials such as sapphire, the most satisfactory abrasive has been found to be diamond, either natural or the artificial products made by General Electric Co. or E. I. DuPont. When cutting softer materials such as silicon, other abrasives such as $Al_2O_3$, $Al_2O_3$—$ZrO_2$ eutectic, cubic boron nitride and SiC may be used. The particular abrasive material and the size of the abrasive particles will depend, as is known to those skilled in the art, on the material to be cut, the desired cutting speed, the smoothness of cut desired, and the acceptable kerf width. Hard workpieces naturally require use of harder abrasives. For smooth cuts and thinner kerfs, smaller abrasive particles should be used. For cutting thin wafers from sapphire ingots, 30, 45 and 60 micron diamond abrasive particles have proved most satisfactory.

To keep the kerf width as small as possible, it is desirable that the abrasive particles not project beyond the outer edges of the blade or wire and thus increase its effective overall width.

Thus, as shown in FIGS. 3 and 4, the abrasive particles generally are not charged into the entire downwardly-facing semi-circular in transverse cross-section surfaces of blade 14 and wire 14'. Rather, the portions of surface 60 of blade 14 adjacent the side of the blade are free of abrasive particles, as are the corresponding portions of the lower semi-circular surface 63 of wire 14'. In each instance, the portion of the blade or wire into which particles are charged is generally symmetrical about a vertical plane and subtends a downwardly facing arc of less than 180°. The exact size of the arc will, of course, depend on the size of the abrasive particles. Small particles may be charged into surface portions more closely adjacent the sides of the blade or wire without increasing its overall width than can large particles.

Figure 7A:
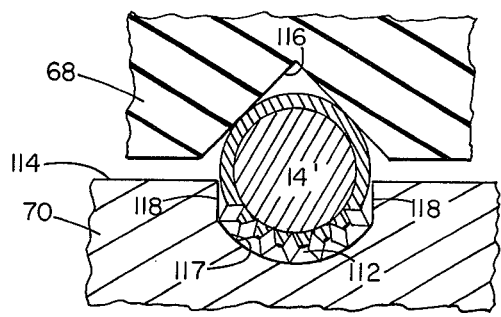
FIGS. 5, 6, 7 and 7a are views of apparatus for charging blades used in the present invention.
Figure 6:
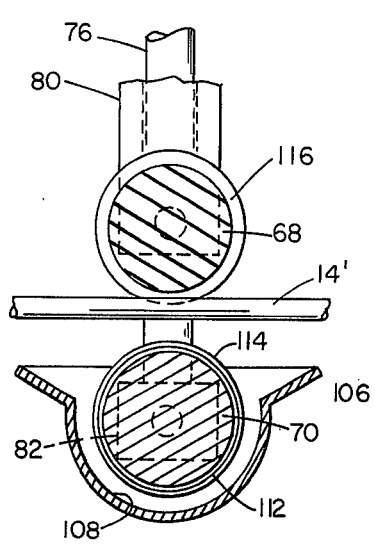
Figure 7:
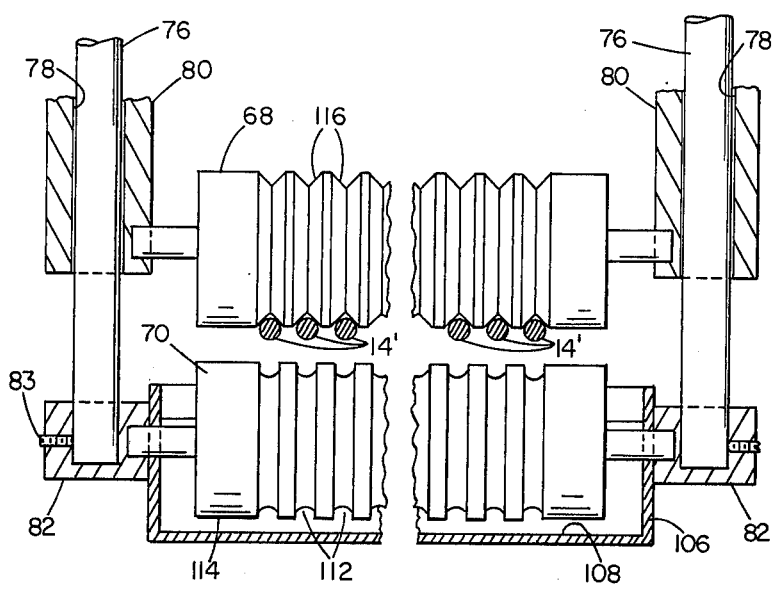
Figure 5:
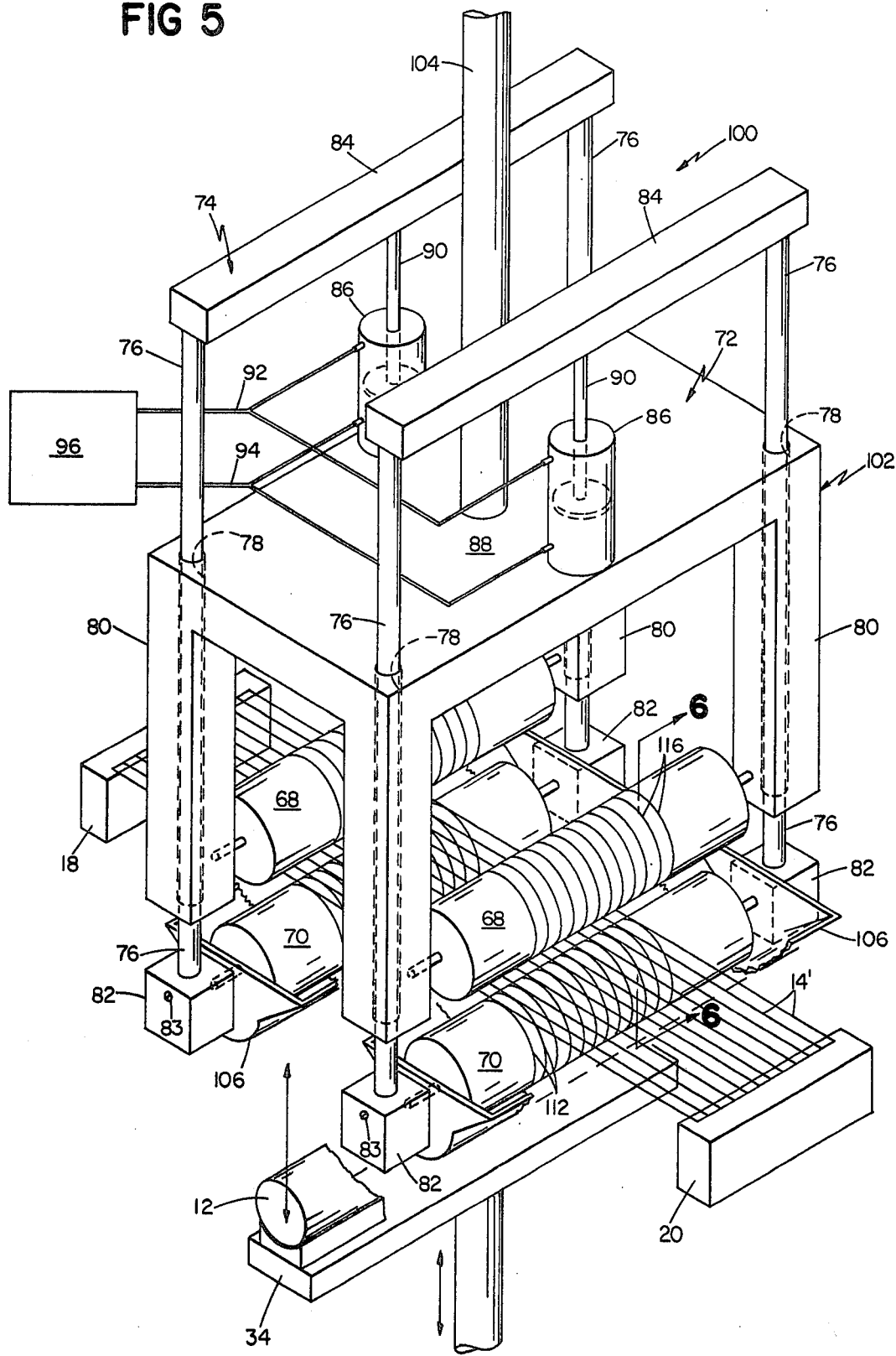

The apparatus for charging the abrasive particles into the blade is shown in FIGS. 5, 6, and 7 and generally designated 100. As illustrated, a frame 102 is mounted on machine 10 by support column 104. The frame carries two pairs of parallel, horizontal rollers, one pair being positioned on each side of workpiece 12 and each roller mounted for rotation about its respective axis. Each pair includes one hard elastomeric (typically nylon) roller and one rigid (typically steel roller). In the illustrated embodiment, hard elastomeric support rollers 68 are mounted above and engage the tops of blades 14 and steel charging rollers 70 are positioned below the blades 14.

Frame 102 includes a fixed (relative to machine 10) portion 72 to which support column 104 and support rollers 68 are attached, and a vertically movable portion 74 supporting charging rollers 70. The movable portion 74 comprises four vertical rods 76 each depending downwardly through a bore 78 in a vertical leg 80 of fixed 72, a roller support block 82 fixed by set screws 83 to the bottom end of each rod 76, a pair of cross-beams 84 each connecting the upper ends of the pair of rods 78 associated with each of support rollers 68, and a pair of pneumatic cylinders 86 each having the cylinder thereof secured to base plate 88 of fixed portion 72 and the piston rod 90 thereof fixed to a respective one of cross-beams 84. Each of charging rollers 70 is supported for rotation about its axis on a pair of blocks 82. Pneumatic control lines 92, 94 connect cylinders 86 to a pneumatic controller, generally designated 76. As will be evident, application of fluid under pressure through lines 94 will cause cylinders 86 to force beams 84 upwardly, drawing charging rollers 70 upwardly against blades 14 and towards support rollers 70. Charging rollers 70 can be moved down, away from blades 14 and support rollers 70, by venting lines 94 and applying fluid under pressure to lines 92.

Each charging roller 70 has a plurality of axially-spaced circumferential grooves 112 in its outer periphery 114, as shown in FIGS. 6 and 7. A generally semicircular in transverse cross-section trough 106 is mounted on blocks 82 coaxially with a respective one of rollers 70 so that the lower half of the roller is within the trough with the periphery 114 of the roller spaced about 1/16 in. from the inner surface 108 of the trough. As shown in FIG. 6, the overall length of each trough 106 is slightly greater than that of the respective roller 70, and the trough is closed at its ends. For purposes of clarity, the grooves in rollers 70 (and in roller 68 as described hereinafter) are not shown in FIG. 5.

The axially-spaced circumferential grooves 112 in the periphery of each roller 70 are each perpendicular to the roller axis and regularly spaced at intervals equal to the distance between adjacent ones of the blades 14 or 14' mounted in blade package 13. As shown most clearly in FIG. 7A, each groove 112 is generally semicircular in cross-section, including an arcuate base 117 and a pair of parallel flat sides 118. The radius of base 116 is equal to that of the soft abrasive-holding portion of the blades (portion 52 of blades 14 and portion 62 of blades 14') plus the nominal size of the abrasive particles. Thus, the grooves whose base 117 have a radius of about 0.0022 are used to load 60 micron abrasive particles into a blade 14, 14' having an overall width of 0.004 inch. To control the portion of the bottom of the respective blade or wire into which abrasive particles are embedded, the overall width of the grooves, i.e., the distance between sides 118, is only slightly greater than that of the blade 14 or wire 14' per se (and less than twice the sum of the radius of the abrasive-holding portion and the nominal size of the abrasive particles). Thus, when the blade is fitted within the grooves, sides 118 insure that abrasive particles are embedded only in the desired downwardly facing portion of the blade or wire; no particles are embedded in the blade sides where they would project outwardly and undesirably increase its effective overall width. The depth of the grooves normally is about the same as the radius of the semi-circular lower surface 62, 63 of the blade abrasive-holding portion.

When cutting with wires 14, it is desirable that each of support rollers 68 also include a plurality of axially-spaced circumferential grooves 116, each of which is arranged to receive the upper portion of a respective wire 14' or blade 14. As shown most clearly in FIG. 7A, each of grooves 116 is V-shaped in transverse cross-section, and thus prevents both vertical and horizontal displacement of the wire or blade. Together, the support rollers 68 on each side of and closely adjacent workpiece 12 greatly reduce blade wander during cutting. When cutting with rectangular in cross-section blades 14 rather than wires 14', grooves 116 may be rectangular rather than V-shaped (or semi-circular as may be desirable for wires) in cross-section; and the rectangular blades should have a relatively low height to width ratio to avoid blade twisting. If blade wander is not a serious problem, grooves 116 may be eliminated.

As will be evident, each support roller 68 forces the blades hard against its associated charging roller 70. The elasticity of one of each pair of rollers (the support roller as illustrated) allows for dimensional variation in the diameter or height of the blades, wires, and abrasive particles. When the charging roller is elastomeric, the elastomeric deformation is often sufficient to eliminate the need for grooves 112.

To charge the abrasive particles 57 into blades 14 or wire 14' troughs 106 are filled with an abrasive paste or thick slurry i.e., a mixture of abrasive particles in a carrier consisting of a fluid, paste, or thick oil. A diamond abrasive paste found to be useful is Grade 45 Diamond-Die Compound (sold by Hyprez Division of Engis Corporation, Morton Grove, Ill.) diluted with Hyprez Hyprelube Lubricant (sold by the same company). Charging system 100 is positioned as shown with the top of each of blades 14, 14' bearing against support rollers 68 and, if the support rollers are grooved, fitted into a respective one of support roller grooves 116. Pneumatic cylinders 86 are then pressurized through lines 94 at the pressure needed to drawing charging rollers 70 up against the bottom of blades 14, 14' with the desired charging force. The lower portion of each of blades 14, 14' fits into one of grooves 102 of each of charging rollers 70; the top of each blade bears against support rollers 68 which insure that the blades do not buckle.

The blade head assembly is then reciprocated relative to the rollers, all the while forcing the blades and rollers towards each other with sufficient force to charge (i.e., partially embed) the abrasive particles into the soft edge portion 56, 62. Typically, the force used to charge the blades is in the range of 2 to 10 times the force that will later be used during cutting. For example, when the abrasive is diamond and the finished blade will be used to cut sapphire at a cutting force of about four ounces per blade, the force used in charging may be in the range of eight to forty ounces per blade. The exact force required will be determined empirically and depends on the particular abrasive and blade being used. Preferably, the force used is that necessary to embed the abrasive particles 57 about half way into the soft outer portion of the blades. In the case of blade 14', the depth to which the particles 57 can be embedded is limited by the thickness of the soft outer portion 62.

As should be apparent, the abrasive particles can be embedded into each blade 14 at any desired concentration (particles per unit area). For higher particle concentrations, the concentration of abrasive particles in the abrasive paste or slurry in trough 74 is made higher, and the blade head is reciprocated relative to the roller 64 a greater number of times.

As noted before, abrasive particles are embedded only in those portions of the blades that will actually later be used in cutting a workpiece. There are no particles embedded in the sides and top of the blades. This not only makes for efficient use of expensive diamond abrasive particles but, since abrasive is not fixed in the blade sides, reduces kerf width and the amount of material consumed in slicing. Both these effects are extremely important to a commercially acceptable operation.

Usually the blades 14 or 14' are charged with blade head assembly 13 and charging apparatus 100 mounted in cutting machine 10, as previously described. Alternatively, the blade head assembly 13 may be mounted in some other apparatus which places the blades under tension for charging, and then mounted in machine 10 only after charging is complete.

Regardless of the manner in which the blades are charged, cutting of the workpiece 12 in machine 10 proceeds in the conventional manner, except that an abrasive free cooling fluid such as water and ethylene glycol, rather than an abrasive slurry, is dripped over the blades from the machine's slurry feed system 22. During cutting, charging rollers 70 are moved (by introduction of fluid under pressure to cylinders 86 through lines 92) to a position spaced a short distance below blades 14, 14'. The upward pressure of workpiece 12 keeps the blades 14, 14' within the grooves 116 of support rollers 68, thereby maintaining the axial positioning of the blades relative to the workpiece and greatly reducing blade wander.

During cutting of an ingot, it will often become apparent, principally from a decrease in the cutting rate, that the abrasive particles 57 in blades 14 or 14' have become worn. The present invention makes it possible to recharge the blades, which themselves have usually worn but little because there is no relative movement between them and the abrasive particles, without removing the blades from the blade heads 13. In many instances it is possible to recharge the blades with new sharp abrasive during cutting.

Recharging can be accomplished in either of two ways. If the original concentration of abrasive particles on the blades was not too great, new abrasive particles simply may be embedded into the blades. If the original concentration was high, or if for any other reason it is desired to remove the worn abrasive, the old particles may first be stripped from the blades and the blades then recharged with new, sharp abrasive particles.

When it is only necessary to add new abrasive particles, any of several procedures may be followed. Preferably charging apparatus 100 is permanently mounted on the wafering machine, and recharging is accomplished simply by drawing charging rollers 70 and their associated charging slurry troughs 106 back up into the charging position in which blades 14, 14' are forced into charging roller grooves 112 with the desired force. In this manner, the blades may be recharged without removing the workpiece or blade package from the wafering machine. Normally, workpiece 12 is withdrawn from the blades, by lowering workpiece support 34, during recharging. When the wafers being cut from the workpiece are relatively thick, and surface smoothness is not a serious problem, recharging may be accomplished while cutting continues.

Alternatively, the blade package 13 may be removed from wafering machine 10 and mounted in a second wafering machine or similar apparatus which will hold the blades under tension. The blades 14 or 14' may then be recharged using charging apparatus 100 and reciprocating the blade package relative to the charging apparatus while forcing the blades 14, 14' and rollers 90 together with the desired force.

A third method is to recharge the blades during cutting by spraying a fine mist of abrasive particles in oil into the cutting interface between blades 14, 14' and workpiece 12. When this is done, the cutting force between the workpiece and blades embeds the new particles into the soft abrasive retaining portion 56, 62 of each blade. One diamond particle-oil mist that has been found useful in the practice of this last method is S-1313 Oil Soluble Slurry Diamond Compound grades 35 and 40, sold by Hyprez Division of Engis Corporation, mixed with extra oil to provide the desired suspension. This third method usually results in a lower concentration of abrasive embedded in the blades than does charging using apparatus 100, and therefore is used only when a high cutting rate is not necessary.

When it is desired to remove, i.e., strip, the worn abrasive particles from the blades before recharging, it is usually desirable to first separate workpiece 12 and blades 14, 14', either by removing the blade package from wafering machine 10 or, preferably, by lowering submount 34 away from the blades. Stripping is then accomplished using a modified three-body abrasion processes. Round or blocky abrasive particles, such as $B_4C$, are introduced between blades 14, 14' and a dummy workpiece, typically a graphite block, by spraying or flooding over the work. The blades and block are then relatively reciprocated while forcing them towards each other with a force about equal to that used in blade recharging. As the blades reciprocate, the blocky abrasive particles roll between the blades and block, stripping the old abrasive particles. In some cases, stripping may be accomplished without separating blades 14, 14' and workpiece 12, simply by spraying or flooding blocky particles over the blades and workpiece as cutting of the workpiece continues. After stripping by whichever method has been completed, the blades can then be recharged with sharp new abrasive particles as previously described.

Although the present invention has been described with reference to a wafering machine having reciprocating wire or other blades, it should be evident that it can also be employed with other types of blades and cutting machines. For example, continuous bandsaw blades of the general type sold by Dia-Chrome, Inc. of Glendale, Calif., or long wire blades of the type sold by Laser Technology, Inc. may be treated to provide a relatively soft abrasive-holding edge portion and then charged with abrasive, all as previously described herein. The continuous bandsaw blades may, typically, be used in a bandsaw machine such as the Zepher model available from Do-All Company of Des Plaines, Ill.; the long wire saw blades may be used in a wide range of wire saws such as those available from Laser Technology, Inc. of which the "Guillotine" model 2008 is the largest.

Other embodiments will be within the scope of the following claims.

What is claimed is:

1. In the process of cutting a workpiece with abrasive particles in which longitudinally-extending blades are moved relative to the workpiece, that improvement comprising:

providing a blade including a longitudinally-extending abrasive-holding portion of metallic material having a hardness less than that of said abrasive particles overlying a blade core of greater tensile strength, said abrasive-holding portion defining a cutting surface extending between the opposite sides of said blade and defining less than one half the total outer surface of said blade placing said blade under tension adjacent a charging element with said cutting surface of said abrasive-holding portion facing towards and closely adjacent said charging element;

charging said blade by embedding abrasive particles partially into said abrasive-holding portion by moving said blade under tension relative to said element while forcing said cutting surface of said blade and element towards each other and introducing abrasive particles into the interface between said abrasive-holding portion of said blade and said element, the thickness of said abrasive-holding portion being not less than about one-half the nominal size of said particles, and said particles being embedded into a longitudinally-extending segment of said cutting surface of said abrasive-holding portion but not into said sides of said blade.

2. The process of claim 1 wherein said element is said workpiece.

3. The process of claim 1 wherein said charging element comprises a charging roll mounted for rotation about an axis generally perpendicular to the direction of relative movement of said roll and said blade and including an annular groove having a width slightly greater than the width of said abrasive-holding portion, and wherein said blade is charged by positioning said abrasive-holding portion in said groove and embedding said particles into the portion of said abrasive-holding portion facing the base of said groove.

4. The process of claim 3 wherein said charging roll includes a plurality of regularly spaced annular grooves, each of said grooves having a width slightly greater than the thickness of a said abrasive-holding portion of a said blade.

5. The process of claim 1 wherein said blade is generally rectangular in transverse cross-section, said sides of said blade generally parallel to each other and defined at least in part by said core and said cutting surface of said abrasive-holding portion being defined by an edge portion of said blade and being generally perpendicular to said sides.

6. The process of claim 5 including the step of providing said abrasive-holding portion by tempering said edge portion of said blade to a hardness less than that of the remaining portion of said blade.

7. The process of claim 1 including the step of providing said abrasive-holding portion by depositing on said blade core a layer of material of hardness less than that of said blade core.

8. The process of claim 1 wherein said blade and said blade core are circular in transverse cross-section and said abrasive-holding portion comprises an annular layer overlying the peripheral surface of said core.

9. The process of claim 5 wherein the portion of said blade into which said particles are embedded defines in transverse cross-section an arc subtending an arc of not more than 180° and having a radius not less than one-half the overall width of said blade.

10. The process of claim 1 including the steps of cutting a portion of said workpiece after said embedding and thereafter recharging said blade by embedding additional abrasive particles at least partially into said abrasive-holding portion by moving said blade under tension relative to and forcing said blade relatively towards a charging element while introducing said additional abrasive particles therebetween.

11. The process of claim 10 including the step of stripping abrasive particles from said blade prior to recharging.

12. The process of claim 11 wherein said particles are stripped by introducing blocky particles between said blade and a workpiece and moving said blades relative to said workpiece while forcing said blades and workpiece relatively towards each other.

13. The process of claim 1 wherein said abrasive-holding portion has a hardness of not more than about 40 $R_c$ and a depth of not more than about 0.025 in.

14. The process of claim 3 including a charging system including said charging roll and a support roll mounted on the side of said blade opposite said charging roll and said abrasive-holding portion, said support roll engaging the side of said blade opposite said cutting surface during said embedding.

15. The process of claim 14 wherein said charging system includes means for moving said charging and support rolls relative to each other in a direction generally perpendicular to the direction of movement of said blade relative to said charging roll.

16. The process of claim 14 wherein said support roll is elastomeric.

17. The process of claim 14 wherein said support roll and said charging roll each include a plurality of axially-spaced annular grooves each aligned with a respective groove of the other.

18. The process of claim 14 wherein said charging system includes two of said support rolls and two of said charging rolls mounted in respective pairs on opposite sides of said workpiece.

19. The process of claim 3 wherein the portion of said blade into which said abrasive particles are charged defines in transverse cross-section an arc subtending not more than 180°, and said groove has an arcuate base of radius greater than that of said arc and subtending an arc of less than 180° and a pair of sides generally perpendicular to the axis of said roll.

20. The process of claim 3 wherein the width of said groove is less than the sum of the width of said abrasive-holding portion plus twice said nominal size of said particles.

21. The process of claim 1 wherein said abrasive-holding portion has a hardness in the range of about 35$R_c$ to about 45$R_c$.

22. The process of claim 5 including the step of forming said blade by heat tempering an edge portion of a rectangular in transverse cross-section steel blade to produce said abrasive-holding portion and a skin portion overlying said abrasive-holding portion, and thereafter removing said skin portion.

23. The process of claim 5 including the step of forming the outer surface of said abrasive-holding portion into a generally semicircular in transverse cross-section configuration of width not greater than the overall thickness of said blade.

* * * * *